US008659173B1

(12) United States Patent
Gambino et al.

(10) Patent No.: US 8,659,173 B1
(45) Date of Patent: Feb. 25, 2014

(54) ISOLATED WIRE STRUCTURES WITH REDUCED STRESS, METHODS OF MANUFACTURING AND DESIGN STRUCTURES

(71) Applicant: International Business Machines Corporation, Armonk, NY (US)

(72) Inventors: Jeffrey P. Gambino, Westford, VT (US); Zhong-Xiang He, Essex Junction, VT (US); Tom C. Lee, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/734,130

(22) Filed: Jan. 4, 2013

(51) Int. Cl.
*H01L 23/52* (2006.01)
*H01L 23/48* (2006.01)
*H01L 29/40* (2006.01)

(52) U.S. Cl.
USPC ............... 257/781; 257/E21.627; 257/784; 438/614

(58) Field of Classification Search
USPC .......... 257/E21.627, E21.641, 459, 503, 584, 257/602, 690, 700, 748, 781, 784, 905; 438/612, 614, 617, 666
See application file for complete search history.

(56) References Cited

U.S. PATENT DOCUMENTS

| 6,093,632 | A | 7/2000 | Lin |
| 6,136,688 | A | 10/2000 | Lin et al. |
| 6,218,302 | B1 * | 4/2001 | Braeckelmann et al. ..... 438/687 |
| 6,451,681 | B1 * | 9/2002 | Greer ........................... 438/601 |
| 6,713,835 | B1 * | 3/2004 | Horak et al. .................. 257/522 |
| 6,943,451 | B2 | 9/2005 | Whitehair et al. |
| 7,393,781 | B2 | 7/2008 | Yakobson et al. |
| 7,442,587 | B2 * | 10/2008 | Amundson et al. ........... 438/149 |
| 7,659,204 | B2 | 2/2010 | Tang et al. |
| 7,972,909 | B2 * | 7/2011 | Chang et al. ................. 438/140 |
| 8,129,842 | B2 | 3/2012 | Yang et al. |
| 8,319,354 | B2 * | 11/2012 | Lin et al. ...................... 257/781 |
| 8,354,598 | B2 * | 1/2013 | Liu ............................... 174/255 |
| 8,384,078 | B2 * | 2/2013 | Kang et al. .................... 257/43 |
| 2002/0079576 | A1 * | 6/2002 | Seshan ......................... 257/737 |
| 2004/0147097 | A1 * | 7/2004 | Pozder et al. ................. 438/584 |

OTHER PUBLICATIONS

Kosemura et al. "Effective control of strain in SOI by SiN deposition", School of Science and Technology, 211th ECS Meeting, The Electromechanical Society, 2007, 1 page.
Kasim et al. "Reliability for Manufacturing on 45nm Logic Technology With High-k + Metal Gate Transistors and Pb-free Packaging", 2009 IEEE 47th Annual International Reliability, pp. 350-353.
U.S. Appl. No. 13/482,864, filed May 29, 2012, not yet published, 26 pages.

\* cited by examiner

*Primary Examiner* — Chris Chu
(74) *Attorney, Agent, or Firm* — Richard M. Kotulak; Roberts Mlotkowski Safran & Cole, P.C.

(57) ABSTRACT

An integrated circuit (IC) including a set of isolated wire structures disposed within a layer of the IC, methods of manufacturing the same and design structures are disclosed. The method includes forming adjacent wiring structures on a same level, with a space therebetween. The method further includes forming a capping layer over the adjacent wiring structures on the same level, including on a surface of a material between the adjacent wiring structures. The method further includes forming a photosensitive material over the capping layer. The method further includes forming an opening in the photosensitive material between the adjacent wiring structures to expose the capping layer. The method further includes removing the exposed capping layer.

22 Claims, 5 Drawing Sheets

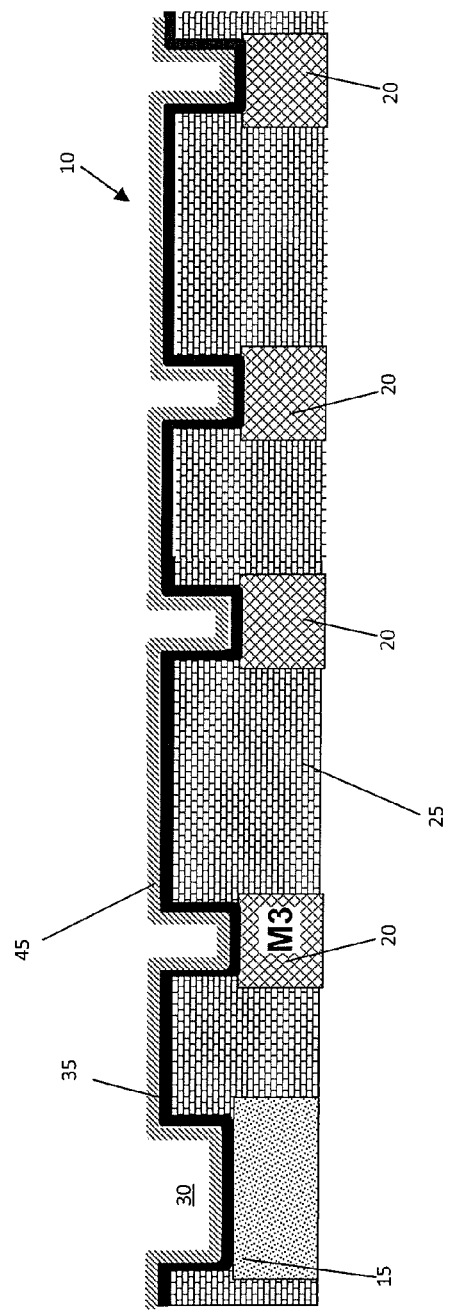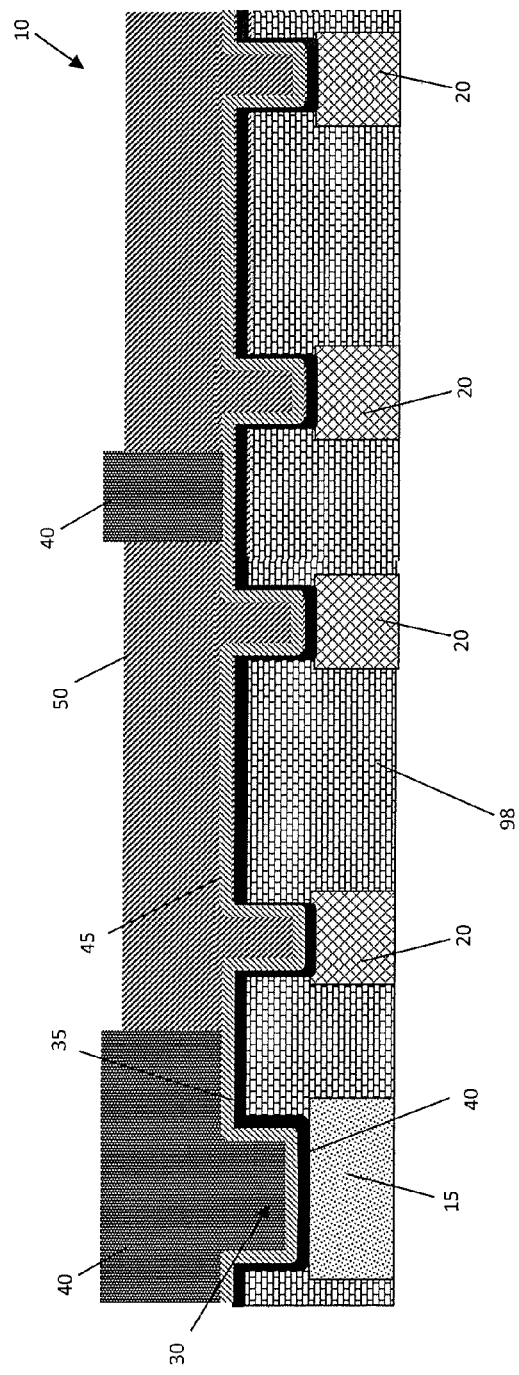
FIG. 1
FIG. 2

ISOLATED WIRE STRUCTURES WITH REDUCED STRESS, METHODS OF MANUFACTURING AND DESIGN STRUCTURES

FIELD OF THE INVENTION

The present invention relates to integrated circuit (IC) chips, and more particularly, to an IC including a set of isolated wire structures disposed within a layer of the IC, methods of manufacturing the same and design structures.

BACKGROUND

During integrated circuit (IC) fabrication, many device layers (e.g., metal layers, dielectric layers, silicon layers, etc.) are often disposed upon and/or proximate one another. These layers may include a plurality of components and may be interconnected to form the IC. Some components, layers, and designs may include the use and/or inclusion of thick (e.g., about 3 µm to about 10 µm) wires. These thick wires may include copper and can be disposed proximate aluminum components/layers in the IC, forming components such as interconnects, portions of inductors, etc. For example, in ICs designed to be used as a part of radio-frequency (RF) technology, thick copper wires are often utilized to produce inductors with a quality factor (e.g., the ratio of inductive reactance to resistance at a given frequency) which meets design specifications.

In such structures, a capping or passivation layer may be disposed over the copper wires, which forms a hermetic seal over the copper wire. These passivation layers may be, for example, SiN layers deposited using conventional plasma enhanced chemical vapor deposition (PECVD) processes. These passivation layers are then covered with a polyimide material (dielectric layer). However, there is a large mismatch in coefficient of thermal expansion (CTE) between the copper, the passivation layers (e.g., SiN) and the dielectric layers. This large CTE mismatch can, in turn, cause cracks in the dielectric layers.

Accordingly, there exists a need in the art to overcome the deficiencies and limitations described hereinabove.

SUMMARY

In an aspect of the present invention, a method of manufacturing a structure comprises forming adjacent wiring structures on a same level, with a space therebetween. The method further comprises forming a capping layer over the adjacent wiring structures on the same level, including on a surface of a material between the adjacent wiring structures. The method further comprises forming a photosensitive material over the capping layer, and forming an opening in the photosensitive material between the adjacent wiring structures to expose the capping layer. The method further comprises removing the exposed capping layer.

In further aspects of the present invention, a method comprises: forming a bond pad and wiring structures in a dielectric layer, at a predetermined level of a structure; forming vias in the dielectric layer, exposing the bond pad and the wiring structures; forming a diffusion barrier layer within the vias and exposed portions of the dielectric layer; and forming a metal over the wiring structures, at a higher level of the structure. The forming of the metal comprises: blocking a via over the bond pad; and forming the metal in the vias over the wiring structures and over portions of the diffusion barrier layer adjacent to the vias over the wiring structures. The method further comprises patterning of the metal to form two separate metal wiring structures with a space therebetween; forming a capping layer over the two separate metal wiring structures, including on a surface of the dielectric layer exposed within the space between the two separate metal wiring structures; forming a photosensitive material over the capping layer; forming an opening in the photosensitive material between the two separate metal wiring structures to expose the capping layer; and removing the exposed capping layer to isolate the two separate metal wiring structures and reduce stress on the structure.

In further aspects of the present invention, a structure comprises a bond pad and a plurality of wiring structures formed at a level above a substrate. The structure further comprises a plurality of metal wiring structures with a space therebetween, formed at a layer above the plurality of wiring structures and the bond pad. The plurality of metal wiring structures is isolated from one another by a space therebetween. The structure further comprises isolated capping layer islands on each of the plurality of wiring structures. The structure further comprises a polyimide material on the isolated capping layer islands, on each of the plurality of wiring structures.

In another aspect of the invention, a design structure tangibly embodied in a machine readable storage medium for designing, manufacturing, or testing an integrated circuit is provided. The design structure comprises the structures of the present invention. In further embodiments, a hardware description language (HDL) design structure encoded on a machine-readable data storage medium comprises elements that when processed in a computer-aided design system generates a machine-executable representation of the wire structures, which comprises the structures of the present invention. In still further embodiments, a method in a computer-aided design system is provided for generating a functional design model of the wire structures. The method comprises generating a functional representation of the wire structures.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

FIGS. 1-5 show cross-sectional views of structures and respective processing steps for forming an integrated circuit in accordance with aspects of the present invention;

DETAILED DESCRIPTION

Figure 3:
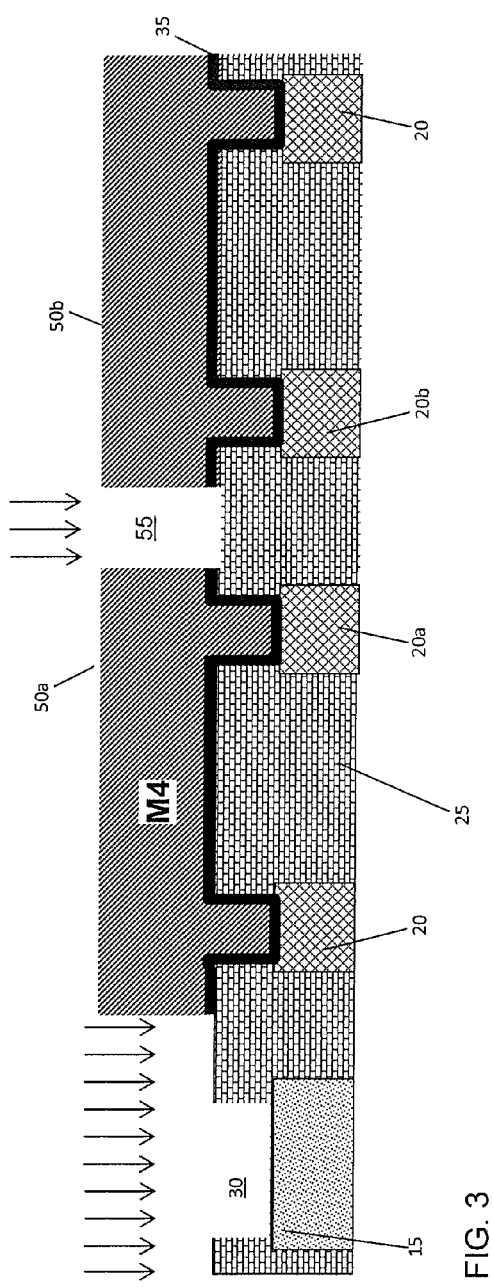

The present invention relates to integrated circuit (IC) chips, and more particularly, to an IC including a set of isolated wire structures disposed within a layer of the IC, methods of manufacturing the same and design structures. In embodiments, the methods of manufacturing the IC reduce stress in the capping layer, eliminating any cracks caused by CTE mismatch. More specifically, in embodiments, the present invention prevents the cracking of a dielectric layer, formed over copper wires.

In embodiments, the present invention prevents cracking of the dielectric layer (and capping layer) by patterning the capping layer into "islands", which relieves a stress component. In embodiments, the capping layer can be SiN or TaN, which is patterned after formation of the wires. The patterning can be provided with minimal additional processing by using a dielectric layer, e.g., polyimide layer, as a masking layer during removal of portions of the capping layer. By breaking up the capping layer into islands, the stress in the capping layer is reduced and the risk of cracking is greatly diminished or eliminated.

FIG. 1 shows a cross-sectional side view of a structure and respective processing steps in accordance with aspects of the present invention. As should be understood by those of ordinary skill in the art, the structure 10 of FIG. 1 is an upper wiring layer, e.g., M3 or above, of an integrated circuit (IC) in accordance with aspects of the present invention. As discussed herein with reference to FIG. 6, the structure shown in FIG. 1 can be part of an IC.

In embodiments, a plurality of wiring structures 15 and 20 are formed in a dielectric layer 25. In embodiments, the wiring structure 15 is an aluminum wire bond pad; whereas, the remaining wires 20 are aluminum wires, for example. In embodiments, the structures 15 and 20 can be comprised of multiple layers of metals, such as Ti/TiN/Al/TiN. As should be understood by those of skill in the art, these wiring structures 15 and 20 can be provided on an upper wiring layer, e.g., M3 level or above, and formed using conventional lithography, etching and deposition processes. The wiring structures 15 and 20 can be formed by metal deposition, lithography, and reactive ion etching, known to those of skill in the art.

After formation of the wiring structures 15, 20, a layer of dielectric material (still referred to as reference numeral 25) can be deposited over the wiring structures 15, 20 and previously formed layer of dielectric material. The dielectric material 25 can comprise SiN, $SiO_2$, polyimide, or combinations of these materials in a layered structure, such as $SiN/SiO_2$/polyimide. As should be understood by those of ordinary skill in the art, portions of the passivation layer will be removed in later processing steps through an etching process to expose portions of the wiring structures 15, 20.

The additional layer of dielectric material 25 can be patterned to form openings (vias) 30. To form the vias 30, a resist layer can be formed over the dielectric layer 25, exposed to energy, e.g., UV light, to form openings, and a reactive ion etching (RIE) can be used to form vias in the dielectric layer 25 (through the openings of the resist). The vias 30 will expose portions of the wiring structures 15, 20, for later processing. A diffusion barrier layer 35 and a seed layer 45 are then formed over the structure, including within the vias 30. In embodiments, the diffusion barrier layer 35 can be, for example, TiN, and the seed layer 45 can be copper. Formation of the diffusion barrier layer 35 and the seed layer 45 may include sputter deposition.

In FIG. 2, a mask 40 is patterned to define wiring layers. The mask covers the opening 30 over the wiring structure 15, e.g., wire bond pad, and masks the spaces between wires. In embodiments, the mask 40 is formed on top of the seed layer 45 (copper seed layer). A metal material 50, e.g., wire, is then formed over the seed layer 45, not covered by mask 40, e.g., resist pattern. The wire 50 can be a copper wire formed by an electroplating process. The copper wire 50 can be formed to a thickness of about 3 μm to about 10 μm; although other thick wires are contemplated by the present invention.

In FIG. 3, the mask, e.g., resist, is removed over the wiring structure 15, e.g., bond pad, using conventional oxygen ashing processes. The seed layer 45 and barrier diffusion layer 35, over the wiring structure 15, e.g., bond pad, can be removed using conventional wet etches (as represented by the arrows of FIG. 3). This etching process will expose the bond pad 15, substantially adjacent to the wire structures. In addition, the wet etch process can remove the seed layer 45 and barrier diffusion layer 35 in the spaces between the wires. In this way, a space 55 is formed between two wiring structures 50a, 50b (e.g., M4 or above wiring layer). The space 55 forms an isolation between the two wiring structures 50a, 50b.

Figure 4:
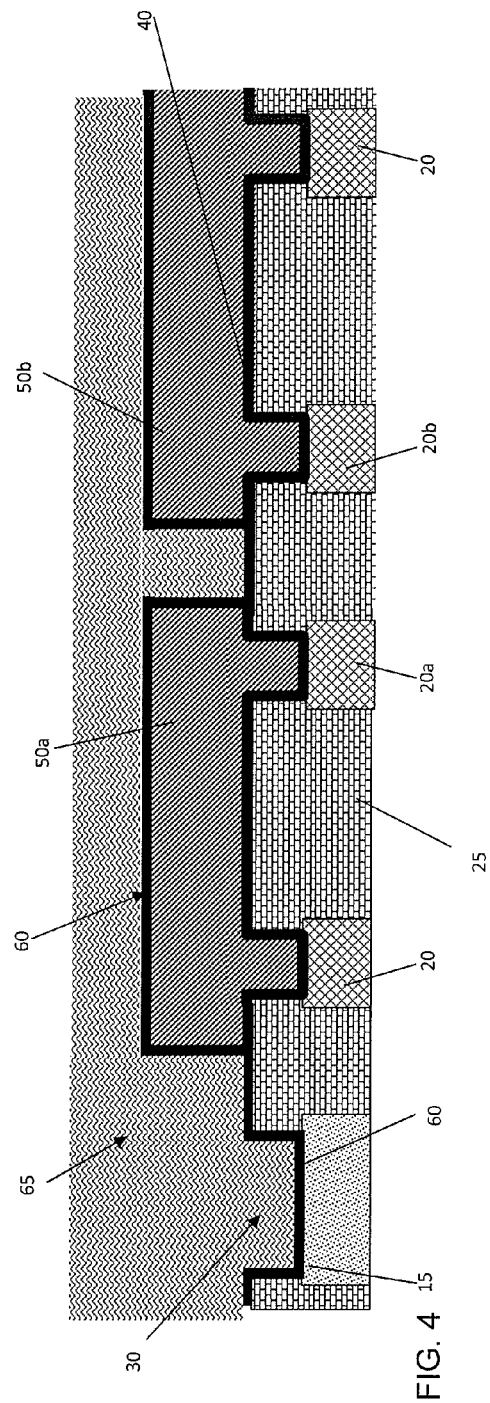

In FIG. 4, a passivation layer (e.g., capping layer) 60 is blanket deposited over the structure, including over the two wiring structures 50a, 50b, the space 55 between the two wiring structures 50a, 50b and within the via 30 over the bonding pad 15. In embodiments, the capping layer 60 is SiN or TaN or other conductive metal, for example, deposited using plasma enhanced chemical vapor deposition (PECVD) or PVD processes. In embodiments, the thickness of the capping layer 60 can be about 50 nm to about 200 nm; although other dimensions are also contemplated by the present invention. A photosensitive material 65 is then deposited on the capping layer 60. In embodiments, the photosensitive material 65 can be a positive tone polyimide material deposited using a conventional blanket deposition process.

Figure 5:
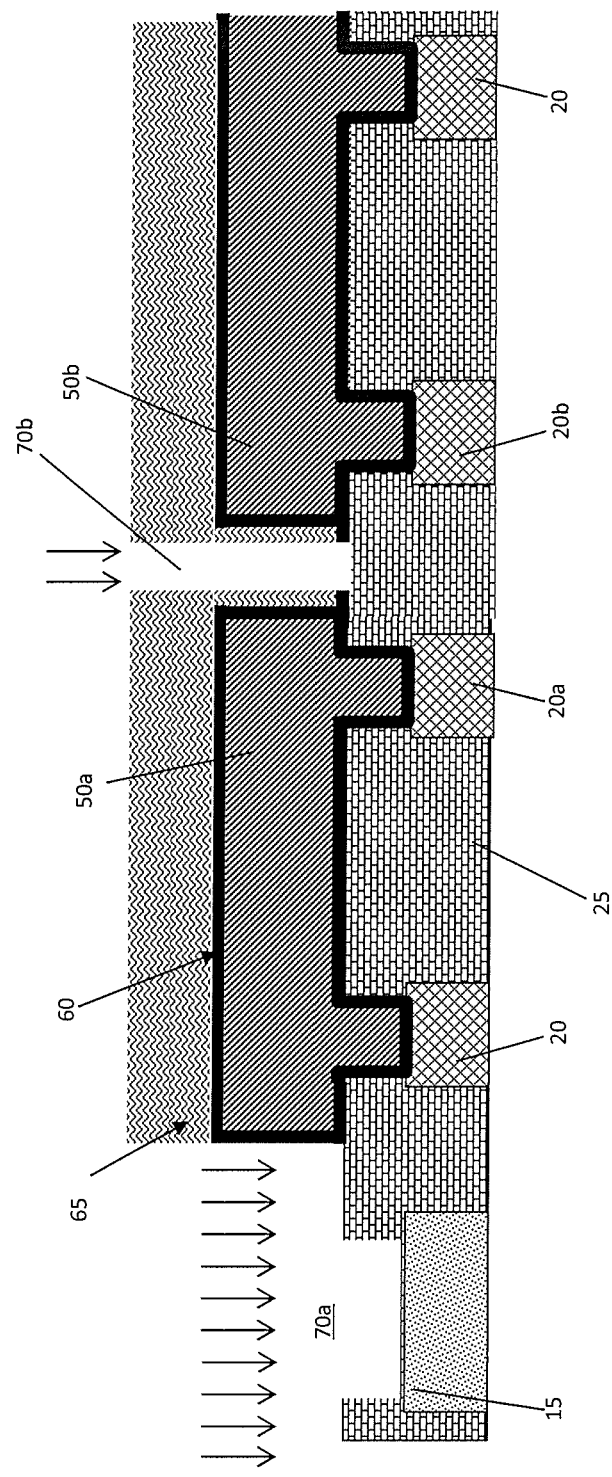

FIG. 5 shows additional processing steps and a respective structure in accordance with aspects of the present invention. In particular, the photosensitive material 65 is baked to drive off any solvents. This baking process can be, for example, performed at about 100° C. to about 300° C. for about 5 minutes. The baked photosensitive material 65 is then exposed to energy, e.g., UV light, through a mask, to form openings 70a, 70b, e.g., patterns. As should be understood by those of ordinary skill in the art, energy will enable dissolution of the photosensitive material 65 during a subsequent develop step, in selected areas corresponding to a masked pattern, thereby forming the openings 70a, 70b.

As further shown in FIG. 5, the opening 70a is provided over the bond pad 15 (and adjacent regions) and opening 70b is provided between the wiring structures 50a, 50b. The photosensitive material 65 can be hardened to make the material thermally stable, e.g., hard, by an annealing process. The annealing process may take place at about 300° C. to 400° C. for about 30 minutes.

Still referring to FIG. 5, the hardened photosensitive material 65 will now act as a mask for subsequent etching processes. In the subsequent etching processes (as represented by the arrows), the exposed portions of the capping layer 60 can be removed using conventional RIE, for example. The removal of the capping layer 60 will isolate the wiring structures 50a, 50b and expose the bonding pad 15. In this way, the capping layer 60 will be formed into isolated islands, encompassing the respective wiring structures 50a, 50b. Also, in this way, the capping layer 60 will no longer be located between the wiring structures 50a, 50b, making the structure less prone to cracking due to any CTE mismatch between the materials deposited thereon, particularly at the corners of the wiring structures 50a, 50b, where there may be high stress concentrations.

Figure 6:
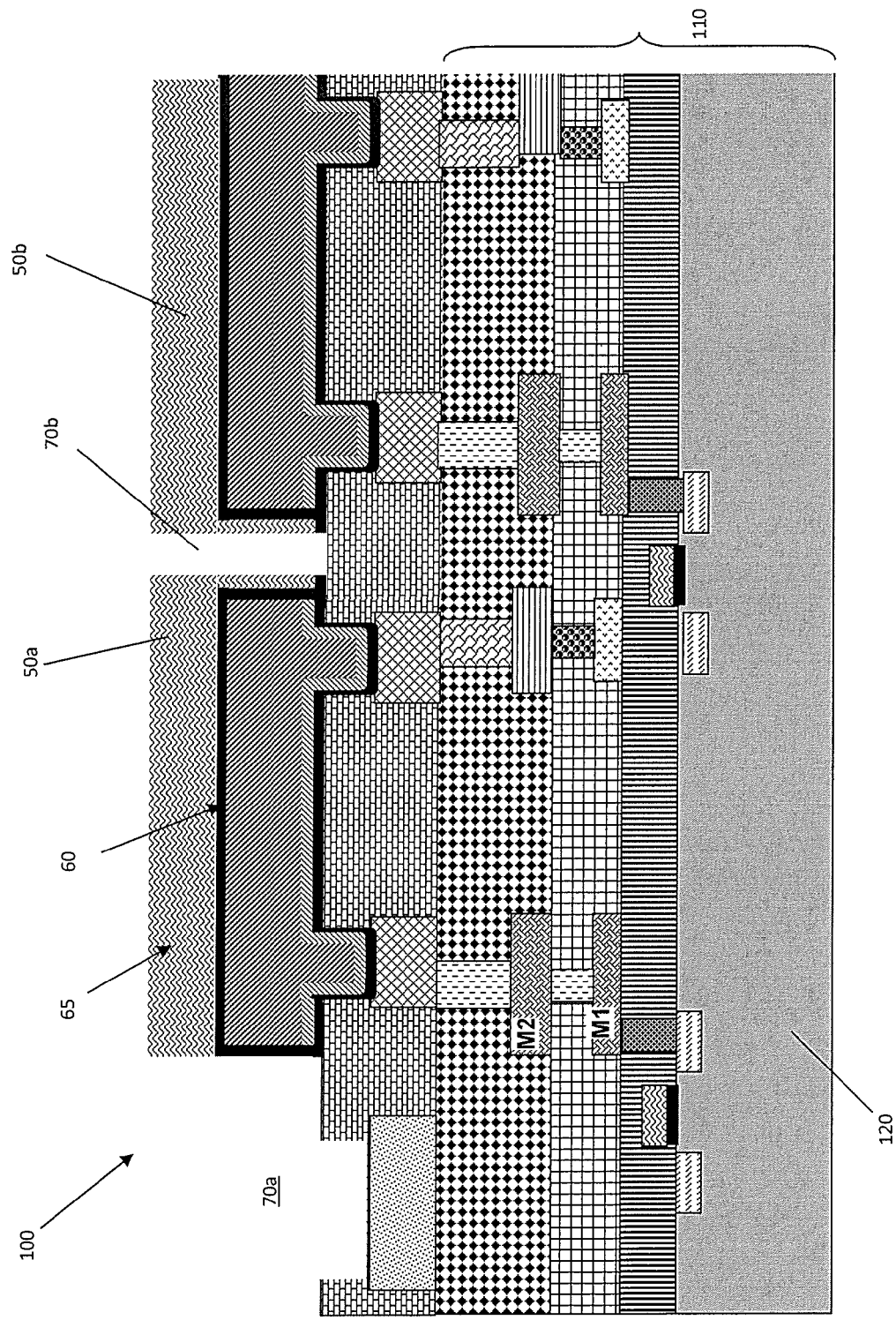
FIG. 6 shows a cross-sectional view of an integrated circuit in accordance with aspects of the present invention.

FIG. 6 shows a structure in accordance with aspects of the present invention. In particular, the structure 100 includes several layers, designated as reference numeral 110. These several layers 110 are provided below the M3 and M4 wiring layers shown in FIGS. 1-5. The several layers include wiring layers, e.g., M1, M2, comprising passive and/or active devices, which may be in electrical contact with the upper wiring layers M3, M4. In embodiments, the several wiring layers are provided on a wafer 120 and are embedded within dielectric layers, e.g., $SiO_2$, etc. The wafer 120 can be, for example, silicon, germanium, silicon germanium, silicon carbide, and those comprising essentially of one or more Group III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). The wafer 120 may also be comprised of Group II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). The processes to provide substrate 110, as illustrated and described, are well known in the art and thus, no further description is necessary.

Figure 7:
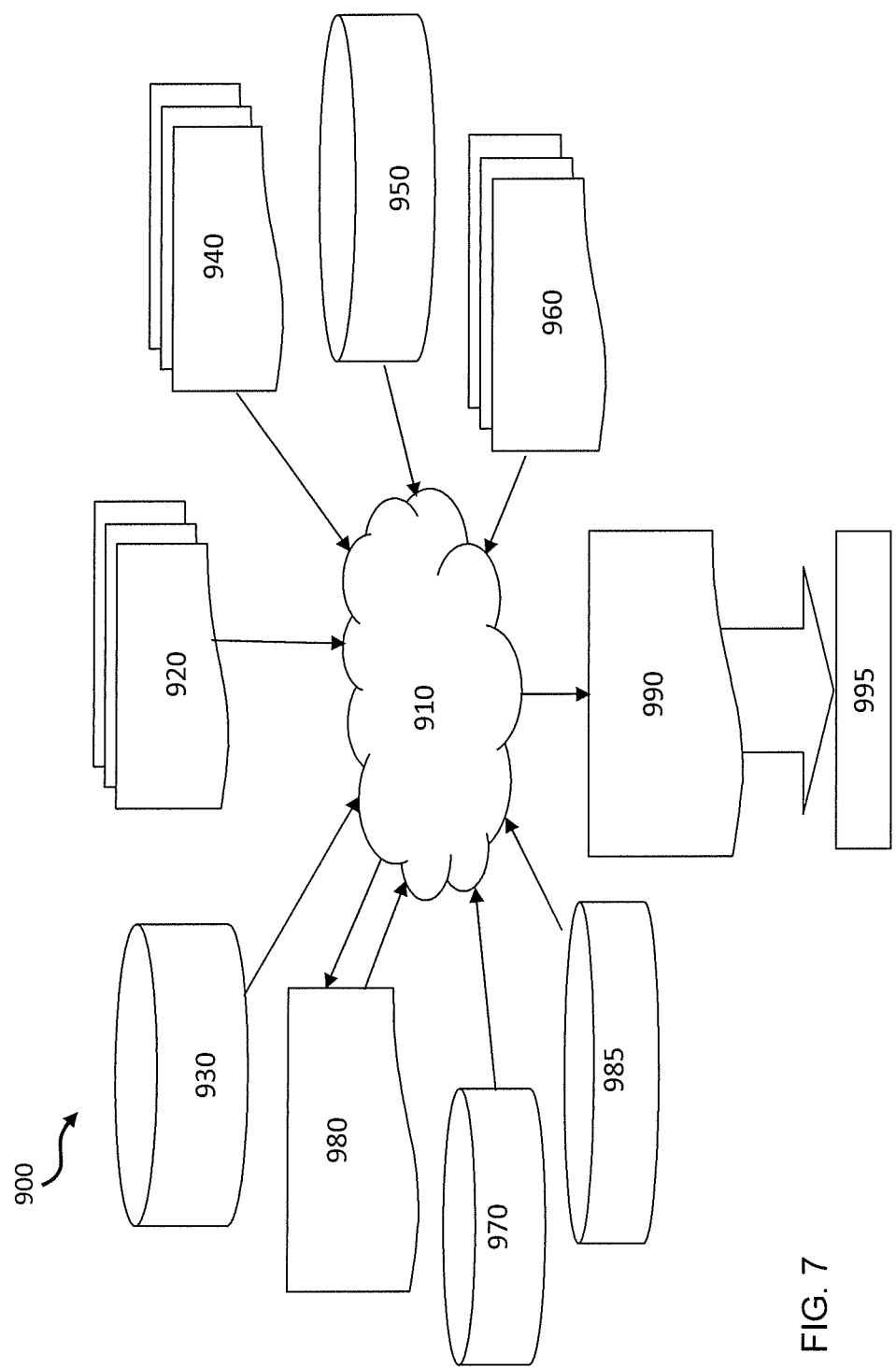
FIG. 7 is a flow diagram of a design process used in semiconductor design, manufacture, and/or test according to embodiments of the invention.

FIG. 7 is a flow diagram of a design process used in semiconductor design, manufacture, and/or test. FIG. 7 shows a block diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above and shown in FIGS. 1-6. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 7 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 1-6. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 1-6 to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990.

Design structure 990 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-6. In one embodiment, design structure 990 may comprise a compiled, executable HDL simulation model that functionally simulates the devices shown in FIGS. 1-6.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-6. Design structure 990 may then proceed to a stage 995 where, for example, design structure 990: proceeds to tape-out, is released to manufacturing, is released to a mask house, is sent to another design house, is sent back to the customer, etc.

The circuit as described above is part of the design for an integrated circuit chip. The chip design is created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer transmits the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be foimed on a wafer. The photolithographic masks are utilized to define areas of the wafer (and/or the layers thereon) to be etched or otherwise processed.

The methods as described above are used in the fabrication of integrated circuit chips. The resulting integrated circuit chips can be distributed by the fabricator in raw substrate form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of manufacturing a structure, comprising:
   forming adjacent wiring structures on a same level, with a space therebetween;
   forming a capping layer over the adjacent wiring structures on the same level, including on a surface of a material between the adjacent wiring structures;
   forming a photosensitive material over the capping layer;
   forming an opening in the photosensitive material between the adjacent wiring structures to expose the capping layer; and
   removing the exposed capping layer.

2. The method of claim 1, wherein the forming of the adjacent wiring structures on a same level comprises:
   depositing a metal material on a diffusion barrier layer;
   patterning the metal material to form the space therebetween; and
   removing the diffusion barrier layer.

3. The method of claim 1, wherein the metal material is copper formed by an electroplating process.

4. The method of claim 1, wherein the photosensitive material is a positive tone polyimide material deposited using a blanket deposition process.

5. The method of claim 4, wherein the forming of the opening in the positive tone polyimide material comprises exposing the positive tone polyimide material to energy through a patterned mask, which will result in dissolution of portions of the positive tone polyimide material in a developer.

6. The method of claim 5, further comprising hardening the positive tone polyimide material to form a mask.

7. The method of claim 6, wherein the hardening comprising an annealing process.

8. The method of claim 6, wherein the removing the exposed capping layer comprises a reactive ion etching process, using the hardened positive tone polyimide material as the mask.

9. The method of claim 8, wherein the reactive ion etching isolates the adjacent wiring structures.

10. The method of claim 8, wherein the reactive ion etching forms islands of the capping layer.

11. The method of claim 10, wherein the capping layer is SiN or TaN.

12. A method comprising:
   forming a bond pad and wiring structures in a dielectric layer, at a predetermined level of a structure;
   forming vias in the dielectric layer, exposing the bond pad and the wiring structures;
   forming a diffusion barrier layer within the vias and exposed portions of the dielectric layer;
   forming a metal over the wiring structures, at a higher level of the structure, wherein the forming of the metal comprises:
      blocking a via over the bond pad; and
      forming the metal in the vias over the wiring structures and over portions of the diffusion barrier layer adjacent to the vias over the wiring structures;
   patterning of the metal to form two separate metal wiring structures with a space therebetween;

forming a capping layer over the two separate metal wiring structures, including on a surface of the dielectric layer exposed within the space between the two separate metal wiring structures;

forming a photosensitive material over the capping layer;

forming an opening in the photosensitive material between the two separate metal wiring structures to expose the capping layer; and removing the exposed capping layer to isolate the two separate metal wiring structures and reduce stress on the structure.

13. The method of claim 12, wherein the metal is copper formed by an electroplating process.

14. The method of claim 12, wherein:
the photosensitive material is a positive tone polyimide material; and
the forming of the opening in the positive tone polyimide material comprises exposing the positive tone polyimide material to energy through a patterned mask, which will result in dissolution of portions of the positive tone polyimide material over the bond pad and between the two separate metal wiring structures, during a subsequent develop step.

15. The method of claim 14, further comprising hardening the positive tone polyimide material to form a mask, wherein:
the hardening comprises an annealing process; and
the removing the exposed capping layer comprises a reactive ion etching process, using the hardened positive tone polyimide material as the mask.

16. The method of claim 14, wherein the reactive ion etching isolates the two separate metal wiring structures.

17. The method of claim 14, wherein the reactive ion etching forms islands of the capping layer.

18. The method of claim 17, wherein the capping layer is SiN or TaN.

19. A structure, comprising:
a bond pad and a plurality of wiring structures formed at a level above a substrate;
a plurality of metal wiring structures with a space therebetween, formed at a layer above the plurality of wiring structures and the bond pad, the plurality of metal wiring structures being isolated from one another by a space therebetween;
isolated capping layer islands on each of the plurality of wiring structures; and
a polyimide material on the isolated capping layer islands, on each of the plurality of wiring structures.

20. The structure of claim 19, wherein the plurality of wiring structures are thick wires on an order of between about 3 μm to about 10 μm.

21. The structure of claim 19, wherein each of the isolated capping layer islands are isolated from each other by a break in capping material within the space between each of the plurality of metal wiring structures.

22. A method in a computer-aided design system for generating a functional design model of a structure with a thick copper wiring layer, the method comprising:
generating a functional representation of a bond pad and a plurality of wiring structures formed at a level above a substrate;
generating a functional representation of a plurality of metal wiring structures with a space therebetween, formed at a layer above the plurality of wiring structures and the bond pad, the plurality of metal wiring structures being isolated from one another by a space therebetween; and
generating a functional representation of isolated capping layer islands on each of the plurality of wiring structures; and
generating a functional representation of a polyimide material on the isolated capping layer islands, on each of the plurality of wiring structures.

* * * * *